United States Patent [19]

Yokoyama

[11] 4,103,245

[45] Jul. 25, 1978

[54] TRANSISTOR AMPLIFIER FOR LOW LEVEL SIGNAL

[75] Inventor: Kenji Yokoyama, Hamamatsu, Japan

[73] Assignee: Nippon Gakki Seizo Kabushiki Kaisha, Hamamatsu, Japan

[21] Appl. No.: 715,200

[22] Filed: Aug. 17, 1976

[30] Foreign Application Priority Data

| Aug. 29, 1975 | [JP] | Japan | 50-104081 |
| Aug. 29, 1975 | [JP] | Japan | 50-104082 |
| Aug. 29, 1975 | [JP] | Japan | 50-104083 |
| Aug. 29, 1975 | [JP] | Japan | 50-118310[U] |
| Aug. 29, 1975 | [JP] | Japan | 50-118311[U] |

[51] Int. Cl.² .................. H03F 3/183; H03F 3/68
[52] U.S. Cl. .................................. 330/265; 330/295
[58] Field of Search .............. 330/13, 28, 30 R, 22, 330/40

[56] References Cited

U.S. PATENT DOCUMENTS

| 2,695,930 | 11/1954 | Wallace | 330/26 X |
| 2,882,353 | 4/1959 | Freedman | 330/30 R X |
| 3,172,050 | 3/1965 | Ingle | 330/30 R X |
| 3,375,455 | 3/1968 | Mutta | 330/13 |
| 3,501,712 | 3/1970 | Webb | 330/30 R |

FOREIGN PATENT DOCUMENTS 483,156  1/1973  Japan.

OTHER PUBLICATIONS

Nelson, "Stabilization of Parallel Transistor Amplifiers" Proceedings of the IEEE, Jan. 1972, p. 140.

Primary Examiner—James B. Mullins
Attorney, Agent, or Firm—Cushman, Darby & Cushman

[57] ABSTRACT

A transistor amplifier circuitry for low level signal which employs, as the amplifying element of at least its input state circuit, a transistor having a low input resistance. Thus, this transistor amplifier circuitry has a true (not apparent) input resistance sufficiently lower than the impedance of a signal source which may be connected to the transistor amplifier circuitry. Therefore, this transistor amplifier circuitry for low level signal is capable of amplifying, with a high S/N ratio, the signal from the signal source of a low impedance.

7 Claims, 7 Drawing Figures

TRANSISTOR AMPLIFIER FOR LOW LEVEL SIGNAL

BACKGROUND OF THE INVENTION (a) Field of the Invention

The present invention concerns a transistor amplifier circuitry for amplifying a low level input signal with a high S/N ratio, and also pertains to a low-noise transistor intended for low level input signal which is most suitable as an amplifying element for use in the input stage circuit of such transistor amplifier circuitry.

(b) Description of the Prior Art

Known transistor amplifier circitry intended for low level input signal and required to have a good S/N ratio, is arranged to be operative in such a way as to minimize noises produced from the transistors which constitute the amplifier circuitry by appropriately setting the operating conditions of these transistors. More particularly, in such a known amplifier circuitry, the emitter current as well as the collector current of the component transistors are set at as small a value as possible. However, in a transistor, the values of the collector current and the emitter current both exert not a small influence upon such properties of the amplifier circuitry as the current amplification factor and the cut-off frequency. Accordingly, it is not easy to realize an optimum S/N ratio by relying on such known techniques as those mentioned above. Moreover, even when the collector current and the emitter current of the transistors are set at such values as will cause the S/N ratio to be at the optimum condition, it still is not possible to improve this S/N ratio to such an extent as is expected and desired.

After extensive researches and experiments, the inventor has discovered that such problems as discussed above encountered in the known transistor amplifier circuitries for low level signal are attributable essentially to the properties per se of the known transistors designed for low input signals. More particularly, let us now refer to FIG. 1. The noise equivalent circuit of the trnsistors is expressed in a manner as shown in FIG. 1. In this figure, symbols B, C and E represent the base electrode, the collector electrode and the emitter electrode, respectively. Symbols $r_{bb}$, $r_c$ and $r_e$ represent the base spreading resistance, the collector resistance and the emitter resistance, respectively, based on the assumption that none of these resistances will cause noises. Symbols $i_{ne}$ and $i_{nc}$ represent equivalent current sources of noise which are produced from the emitter portion and the collector portion, respectively. Also, symbol $v_{nb}$ represents an equivalent voltage source of noises produced from the base spreading resistance $r_{bb}$. Thus, under the assumption that the above-mentioned noises from the above-mentioned respective noise sources contain no excess noises (flicker noises), these noises are expressed by the following equations:

$$i_{ne} = \sqrt{2q(I_E + 2I_{ES})\Delta f} \qquad \text{Eq. 1}$$

$$i_{nc} = \sqrt{2q I_C \Delta f} \qquad \text{Eq. 2}$$

$$v_{nb} = \sqrt{4kT\, r_{bb}\, \Delta f} \qquad \text{Eq. 3}$$

wherein:
k represents a Boltzmann constant;
T represents an absolute temperature;
$\Delta f$ represents the width of the noise equivalent band;
q represents the charge on a single electron;
$I_E$ and $I_C$ represent the emitter current and the collector current, respectively; and
$I_{ES}$ represents the saturation inverse current at the emitter junction.

As will be clear from the above equations, in the known transistor amplifier circuitry intended for low level signal, it is arranged so that the emitter current $I_E$ and the collector current $I_C$ of the component transistors, especially of the transistor provided on the input stage, are set to have minimal values to reduce both the noises $i_{ne}$ produced from the emitter portion and the noises $i_{nc}$ produced from the collector portion of the transistor. However, the transistor of the prior art intended for low level signal is such that its base spreading resistance $r_{bb}$ has a value distribution ranging from several scores of ohms to several hundreds of ohms. Therefore, even where a device for a reduction of noises $i_{ne}$ and $i_{nc}$ in a manner described above is incorporated in the prior art such circuitry, there are developed thermal noises $v_{nb}$ of a great magnitude which come from the high base spreading resistance $r_{bb}$. Thus, no sufficient improvement of the S/N ratio in amplifier circuitries is attained. This fact has been elucidated by the inventor as a result of his extensive series of experiments and researches conducted for an extended period of time on prior art transistors intended for low level input signals.

According to the observation of the inventor, the reasons why the above-said shortcomings of the known transistors for low level signals have not been improved are considered to be related to an erroneous concept in the designing of the conventional transistor amplifier circuitries intended for low level signals. Regarding this point, explanation will be made hereunder by referring to FIG. 2.

FIG. 2 shows a general arrangement of a transistor amplifier circuitry for low level signal. In this figure, symbol A represents a phase-inverting amplifier circuit. $R_f$ represents a resistor for feeding, back to the input side, the output of this phase-inverting amplifier circuit. $R_i$ represents a resistor for connecting the input terminal P to the input terminal IN, of the phase-inverting amplifier circuit A. Symbol $R_g$ represents a true input resistance of the phase-inverting amplifier circuit A. Assuming that this phase-inverting amplifier circuit A has a sufficiently large open loop gain, the apparent input impedance $Z_i$ as viewed from the input terminal IN and the gain G of the transistor amplifier circuitry for low level signal having the afore-mentioned arrangement will be expressed by the following equations:

$$G \doteqdot \frac{R_f}{R_g} + \frac{R_f}{R_i} = \frac{R_f(R_i + R_g)}{R_i \cdot R_g} \qquad \text{Eq. 4}$$

$$Z_i \doteqdot R_i \qquad \text{Eq. 5}$$

Now, the true input resistance $R_g$ of the phase-inverting amplifier circuit A constitutes the principal noise source of this amplifier circuit A, and accordingly, of the transistor amplifier circuitry as a whole intended for low level signal. In order to attain a high S/N ratio of such a circuit of circuitry, it is necessary to minimize the value of said true input resistance $R_g$. Especially, in case the impedance of the signal source which is connected to the circuit or circuitry is low, the S/N ratio will be markedly lowered due to the thermal noises which are produced from the true input resistance $R_g$.

However, as will be understood clearly from Eq. 5 the apparent input impedance $Z_i$ is determined substantially by the value of the resistor $R_i$. Therefore, in the designing, in the past, of the transistor amplifier circuitry for low level signal, there has been hardly paid any consideration to the reducing of this true input resistance $R_g$.

It should be noted here that, in case the input stage circuit of the phase-inverting amplifier circuit is constructed either by the emitter-grounded circuit or by the base-grounded circuit of a transistor, the true input resistance $R_g$ is expressed by the following equation:

$$R_g = \frac{h_{ie}}{h_{fe}} = r_e + \frac{r_{bb}}{h_{fe}} + \frac{kT}{qI_E} + \frac{r_{bb}}{h_{fe}} \qquad \text{Eq. 6}$$

wherein;

$h_{ie}$, $h_{fe}$, $r_{bb}$, $r_e$ and $I_E$ represent the output short circuit input impedance, the output short circuit forward-current transfer ratio, the base spreading resistance, the forward direction resistance at the emitter junction, and the emitter current, respectively.

As will be clear from Eq. 6, in order to minimize the true input resistance $R_g$, the base spreading resistance $r_{bb}$ of the transistor has to be minimized. However, the conventional designing concept lacks the aforesaid concept of making the true input resistance $R_g$ small. Accordingly, in the conventional transistor intended for low level signal, there is hardly given any efforts to the reduction of the base spreading resistance $r_{bb}$.

SUMMARY OF THE INVENTION

It is, therefore, an object of the present invention to provide a low-noise transistor amplifier circuitry for low level signal such as of a level of 50 μV r.m.s. from a moving coil type pick-up for a disk player cartridge.

Another object of the present invention is to provide a transistor amplifier circuitry of the type described above, which is capable of amplifying, at a desirable S/N ratio, an input signal from a signal source of a low impedance.

Still another object of the present invention is to provide a transistor intended for low level signal, which is optimum for use as an amplifying element in the transistor amplifier circuitry of the type described above.

An example of the transistor amplifier circuitry for low level signal according to the present invention is constructed by the use, as an amplifying element, a transistor having an input resistance smaller than the impedance of the signal source which is connected to the input of said transistor amplifier circuitry.

In another example of the transistor amplifier circuitry for low level signal according to the present invention, there is used, as an amplifying element, a compound transistor which is comprised of a number of transistors which are connected in parallel with each other.

In still another example of the transistor amplifier circuitry for low level signal according to the present invention, there is used, as an amplifying element, a power transistor having a small base spreading resistance.

According to a further aspect of the present invention, there is provided a transistor for low level signal, which transistor having its base spreading resistance of 10 ohms or smaller.

These and other objects as well as the features and the advantages of the present invention will be more clearly understood by reading the following detailed description of the present invention in connection with the preferred examples when taken in conjunction with the accompanying drawings.

DETAILED DESCRIPTION OF THE PREFERRED EMBODIMENTS

Prior to making a detailed explanation of the present invention, there will be first described hereunder the basal features of the transistor amplifier circuitry for low signal level according to the present invention.

Figure 2:
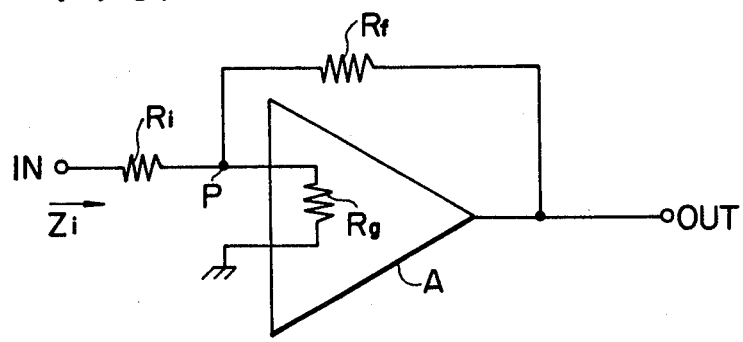
FIG. 2 is an outline of circuit diagram showing a general arrangement of a transistor amplifier circuitry for low level signal.
Figure 3:
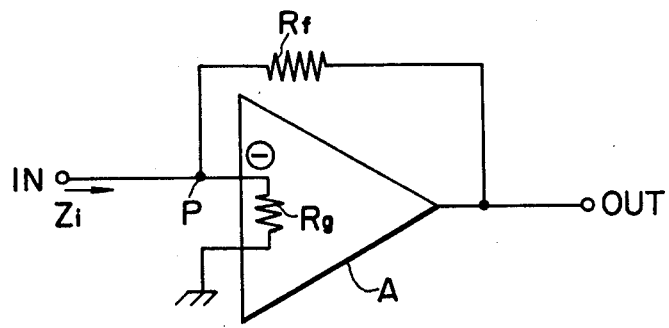
FIGS. 3 through 7 are circuit diagrams showing examples of transistor amplifier circuitry for low level signal according to the present invention, respectively.

FIG. 3 shows an outline of arrangement of a negative feedback amplifier circuit which displays, to the maximum extent, the effects of the present invention. In this arrangement of the negative feedback amplifier circuit, the resistance $R_i$ shown in FIG. 2 is omitted. Therefore, the gain G and the apparent input impedance $Z_i$ are determined exclusively by the resistance $R_f$ and the true input resistance $R_g$ of the phase-inverting amplifier A. According to the present invention, the true input resistance $R_g$ of the phase-inverting amplifier circuit A is made extremely small. By so arranging, the gain G and the apparent input impedance $Z_i$ will be expressed by the following equations:

$$G \doteqdot R_f/R_g \qquad \text{Eq. 7}$$

$$Z_{in} \doteqdot R_g \qquad \text{Eq. 8}$$

In order to satisfy these conditions, according to the present invention, there is used, as an amplifying element which constitutes the initial stage of the phase-inverting amplifier circuit A, a transistor having a very low input resistance, e.g. a known power transistor having a low base spreading resistance $r_{bb}$ such as 10 ohms or smaller, or alternatively a compound transistor which is comprised of a number of component transistors connected to each other in parallel, or further alternatively, a transistor for low level signal according to the present invention as will be described later.

Figure 4:
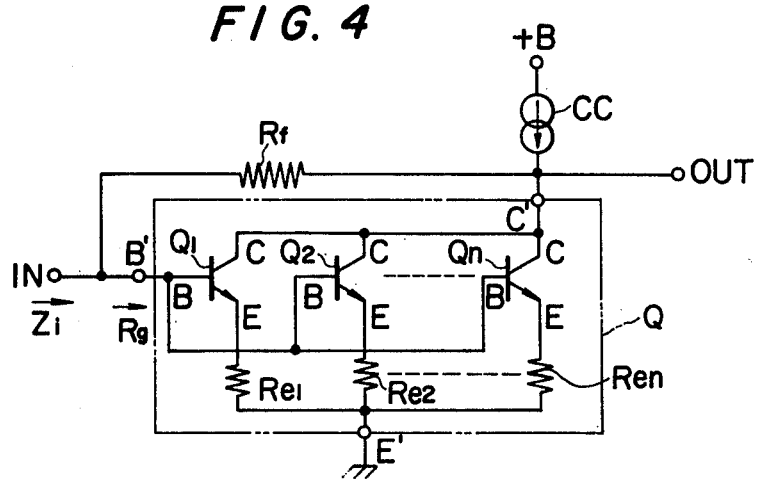

FIG. 4 shows an example of the transistor amplifier circuitry for low level signal according to the present invention. In this example, a compound transistor Q which is comprised of a plural number of transistors $Q_1$, $Q_2$, ..., $Q_n$ in such a manner that their base electrodes B, the collector electrodes C and the emitter electrodes E are connected in common to the base terminal B', the collector terminal C' and to the emitter terminal E', respectively, is used as the amplifying element of the phase-inverting amplifier circuit which corresponds to the circuit indicated at A in FIG. 3. The emitter terminal E' of this compound transistor Q is grounded, and the base terminal B' is connected to the input terminal IN, and the collector terminal C' is connected, via a constant current circuit CC, to a power source +B. In other words, the compound transistor Q, together with the constant current circuit CC, constitutes a phase-inverting amplifier circuit of the emitter grounded type.

The output of this phase-inverting amplifier circuit is negative fed back to the input terminal IN side via a feedback resistor $R_f$. It should be understood that symbols $R_{e1}, R_{e2}, \ldots, R_{en}$ represent resistors having trivial resistance values, which are provided in order to equalize the collector currents of the respective component transistors $Q_1, Q_2, \ldots, Q_n$. These resistances are, however, not needed where the respective component transistors $Q_1, Q_2, \ldots, Q_n$ have equal properties.

The aforesaid compound transistor Q, as stated above, is comprised by respectively parallelly connected transistors $Q_1, Q_2 \ldots, Q_n$. Accordingly, this compound transistor Q has a very low input resistance. Therefore, the transistor amplifier circuitry for low level signal according to the present invention is capable of amplifying, at a high S/N ratio, a signal coming from a low impedance signal source.

Figure 1:
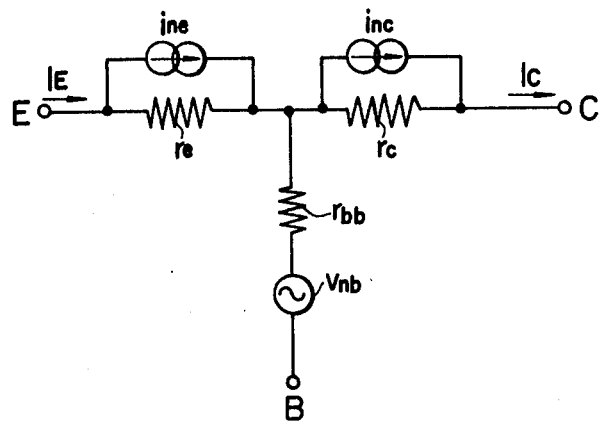
FIG. 1 is a noise equivalent circuit diagram of a transistor.
Figure 5:
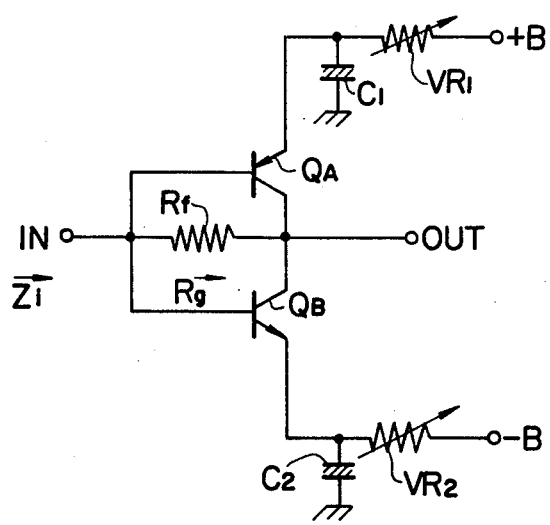

FIG. 5 shows another example of the transistor amplifier circuitry for low level signal according to the present invention. The circuitry of this example is arranged so that a known power transistor is used as the amplifying element to actuate it with a small current at a range where the emitter resistance $r_e$ exhibits smallest values. Almost all of the known power transistors are, in general, such that their base spreading resistance $r_{bb}$ has a value which is several grades lower than the resistance value of a known transistor intended exclusively for low level signal. For example, a transistor 2SC793 having a maximum collector loss of 60 W and a maximum collector current of 7 A is used with a collector current of 0.5 A flowing. As such, the thermal noise $v_{nb}$ (see FIG. 1) of the power transistor is decreased a great deal, whereby a marked improvement of the S/N ratio can be attained. Also, there arises no problem with respect to the noises $i_{ne}$ and $i_{nc}$ (see FIG. 1) since their values can be set to such a low level as will be comparable with the value of a transistor intended exclusively for low level signal, by actuating the power transistor with a small current. Power transistors have large chip sizes and consequently small base spreading resistance $r_{bb}$.

In FIG. 5, symbols $Q_A$ and $Q_B$ represent a PNP-type power transistor and an NPN-type power transistor both having a small base spreading resistance. The emitter electrodes of these transistors $Q_A$ and $Q_B$ are connected to a positive power source +B and a negative power source −B, via variable resistors $VR_1$ and $VR_2$, respectively. Whereas, the collector electrodes of these transistors $Q_A$ and $Q_B$ are connected to a common output terminal OUT. Also, the base electrodes of these two transistors $Q_A$ and $Q_B$ are connected to a common input terminal IN and further to the output terminal OUT via a feedback resistor $R_f$. It should be understood that this resistor $R_f$ acts so as to feed a portion of the output back to the input terminal, and in addition this resistor $R_f$ biases the transistors $Q_A$ and $Q_B$ in the forward direction. Accordingly, these transistors $Q_A$ and $Q_B$ perform Class A behavior. It should be noted that symbols $C_1$ and $C_2$ represent signal bypassing capacitors. These capacitors $C_1$ and $C_2$ are capable of adjusting both the emitter current and the collector current of the transistors $Q_A$ and $Q_B$ by dint of the variable resistors $VR_1$ and $VR_2$, respectively.

The circuitry of the aforesaid example is in compliance with FIG. 3 with respect to its overall arrangement, whereas the single-ended push-pull circuit of the emitter grounded type of the power transistors $Q_A$ and $Q_B$ corresponds to the phase-inverting amplifier circuit A shown in FIG. 3.

Figure 6:
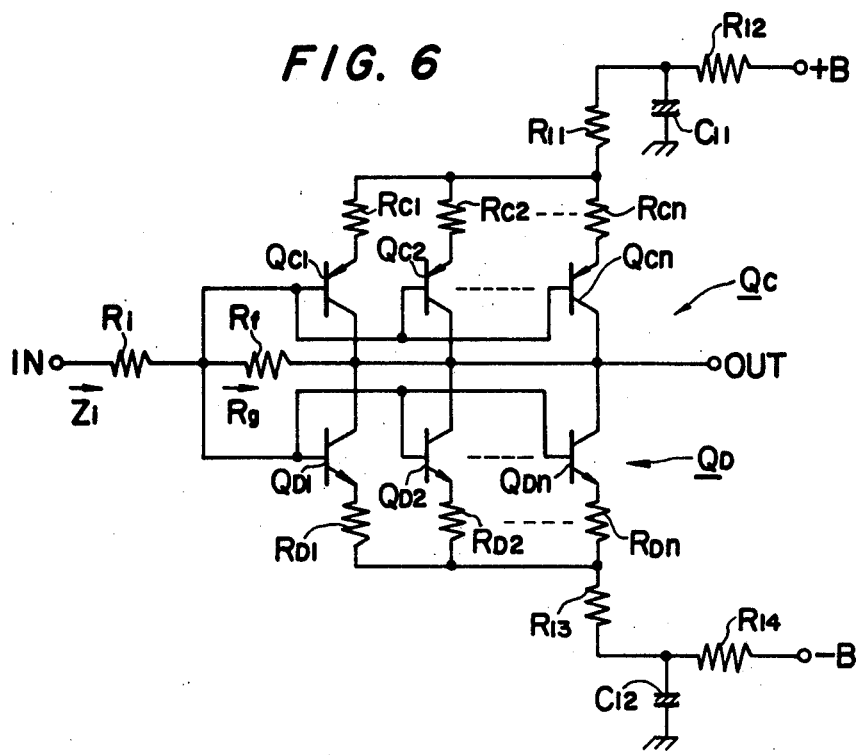

FIG. 6 shows still another example of the transistor amplifier circuitry for low level signal according to the present invention.

In this example, a PNP-type compound transistor $Q_C$ which is comprised of PNP-type transistors $Q_{C1}, Q_{C2}, \ldots, Q_{Cn}$ and an NPN-type compound transistor $Q_D$ which is comprised of NPN-type transistors $Q_{D1}, Q_{D2}, \ldots, Q_{Dn}$ jointly constitute a phase-inverting amplifier circuit A of FIG. 3. The emitter electrodes of these two compound transistors $Q_C$ and $Q_D$ are connected to a positive power source +B and a negative power source −B via resistors $R_{11}, R_{12}$ and resistors $R_{13}, R_{14}$, respectively. The collector electrodes of these two compound transistors $Q_C$ and $Q_D$ are connected to an output OUT, and the base electrodes thereof are connected to an input terminal IN via a common resistor $R_i$. A resistor $R_f$ is connected between the base electrodes of these two compound transistors $Q_C$ and $Q_D$ and the output terminal OUT. This resistor $R_f$ functions so that it feeds a portion of the output signal back to the input side of the phase-inverting amplifier and that, along therewith, it imparts a forward bias to both of the compound transistors $Q_C$ and $Q_D$. Accordingly, the respective component transistors $Q_{C1}, Q_{C2}, \ldots, Q_{Cn}$ and $Q_{D1}, Q_{D2}, \ldots, Q_{Dn}$ of these two compound transistors exert Class A behavior. Symbols $C_1$ and $C_2$ represent signal bypassing capacitors. Symbols $R_{C1}, R_{C2}, \ldots, R_{Cn}$ and $R_{D1}, R_{D2}, \ldots, R_{Dn}$ represent resistors having trivial resistance values which are inserted as required to equalize the emitter currents and/or collector currents of the respective component transistors $Q_{C1}, Q_{C2}, \ldots, Q_{Cn}$ and $Q_{D1}, Q_{D2}, \ldots, Q_{Dn}$.

The instant example employs, as the amplifying elements of the phase-inverting amplifier circuit, a pair of compound transistors $Q_C$ and $Q_D$ which are comprised respectively by a parallel connection of a plural number of transistors $Q_{C1}, Q_{C2}, \ldots, Q_{Cn}$ and $Q_{D1}, Q_{D2}, \ldots, Q_{Dn}$. As a result, the true input resistance $R_g$ (not the apparent input impedance) of this phase-inverting amplifier circuit becomes extremely low. Thus, a high S/N ratio is obtained.

Figure 7:
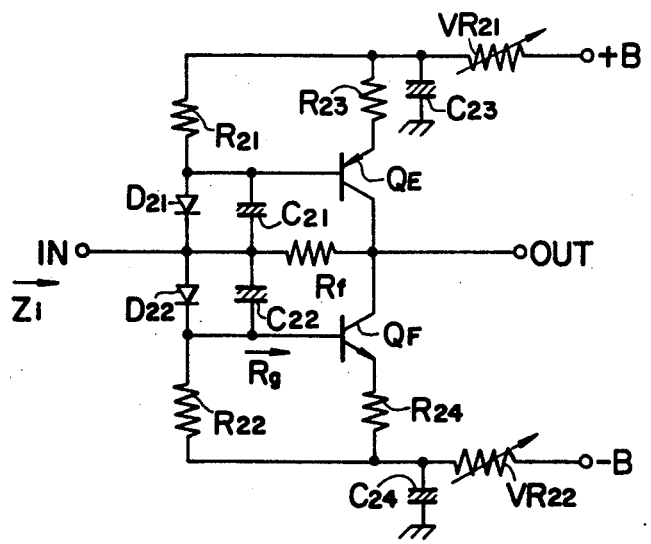

FIG. 7 shows a further example of the transistor amplifier circuitry for low level signal. In this example, there is used, as the amplifying element, a novel low level signal transistor according to the present invention having a base spreading resistance $r_{bb}$ of 10 ohms or less. More particluarly, the inventor became aware of the fact that the conventional low level signal transistors of low noises have a base spreading resistance $r_{bb}$ whose value ranges from several scores of ohms to several hundreds of ohms, and that in case an amplifier circuitry which is comprised of such transistors is connected to a signal source such as a movable coil type cartridge having an impedance of 10 ohms or smaller, the S/N ratio becomes degraded due to the thermal noises $v_{nb}$ of the transistors (see FIG. 1). Based on this recognition, the inventor made tests and researches of many aspects and arrived at the conclusion that an extremely excellent low level signal transistor of low noises can be realized by suppressing the base spreading resistance $r_{bb}$ of the transistor at 10 ohms or lower. It should be understood that among the currently available power transistors, there are those having a base spreading resistance $r_{bb}$ of 10 ohms or lower, and that accordingly there should arise no problem in the manufacture of the transistors according to the present invention.

In FIG. 7, symbols $Q_E$ and $Q_F$ represent a PNP-type transistor according to the present invention and an NPN-type transistor according to the present invention which both have a base spreading resistance $r_{bb}$ of 10 ohms or lower and have a true input impedance which is extremely small in value than the impedance of the signal source. The collector electrodes of these two transistors $Q_E$ and $Q_F$ are connected to a common output terminal OUT. Also, their emitter electrodes are connected to a positive power source +B and a negative power source −B via variable resistors $VR_{21}$ and $VR_{22}$, and via resistors $R_{23}$ and $R_{24}$, respectively. Diodes $D_{21}$ and $D_{22}$ are biased in the forward direction via resistors $R_{21}$ and $R_{22}$, respectively. The anode of the diode $D_{21}$ and the cathode of the diode $D_{22}$ are connected to the base electrodes of the transistors $Q_E$ and $Q_F$, respectively. Symbols $C_{21}$ and $C_{22}$ represent capacitors for the purposes of bypassing and noise-erasing the diodes $D_{21}$ and $D_{22}$, respectively. Symbols $C_{23}$ and $C_{24}$ represent signal bypassing capacitors. Also, a negative feedback resistor $R_f$ is connected between the output terminal OUT and the input terminal IN.

It should be understood that the input resistances of the aforesaid transistors $Q_E$ and $Q_F$ depend on the emitter currents mainly because the emitter resistor $r_e$ is dependent on the emitter current. Accordingly, the true input resistance $R_g$ of the transistor amplifier circuitry according to this example can be set at an optimum value as desired by adjusting the values of the emitter currents of the two transistors $Q_E$ and $Q_F$ by means of the variable resistors $VR_{21}$ and $VR_{22}$. It should be understood that the diodes $D_{21}$ and $D_{22}$ which are in the conducting state serve to clamp, to about 0.6 volt, the inverse voltage applied across the collector-base junctions of the transistors $Q_E$ and $Q_F$, and whereby these diodes serve to reduce the flicker noises (excess noises) of the transistors $Q_E$ and $Q_F$.

It should be understood that each of the transistor amplifier circuitries for low level signal according to the present invention which have been described above is such that it is invariably applied with a negative feedback. However, it is needless to say that these transistor amplifier circuitries for low level signal according to the present invention can have an arrangement wherein there is applied no feedback. The small base spreading resistance is the most significant feature. And the small emitter resistance is also important as well. It should be understood also that the transistor amplifier circuitries for low level signal according to the present invention may be of a multi-stage arrangement.

I claim:

1. An audio amplifier circuit for amplifying a signal of low voltage level supplied by a moving coil-type cartridge source, said amplifier comprising:

an input terminal adapted to be connected to said signal source;
an output terminal;
a power source;
a constant current circuit;
a compound transistor including a plurality of transistors connected in parallel, said compound transistor having a base electrode, an emitter electrode, a collector electrode, and an input resistance of a value less than the value of impedance of said signal source;
the base electrode being connected to the input terminal;
the emitter electrode being grounded;
the collector electrode being connected to the power source via said constant current circuit and also being connected to the output terminal; and
a resistor connected between the output terminal and said input terminal.

2. An audio amplifier circuit for amplifying a signal of low voltage level supplied by a moving coil-type cartridge source, said amplifier comprising:

an input terminal adapted to be connected to said signal source;
an output terminal;
a positive power source;
a negative power source;
a first power transistor of the PNP type, having a base electrode, an emitter electrode, a collector electrode, and an input resistance less than the value of impedance of said signal source;
the base electrode being connected to the input terminal;
the emitter electrode being connected to said positive power source via a first variable resistor and being connected to ground via a first capacitor;
the collector electrode being connected to the output terminal;
a second power transistor, of the NPN type, having a base electrode, an emitter electrode, a collector electrode, and an input resistance less than the value of impedance of said signal source;
the base electrode of said second transistor being connected to the input terminal;
the emitter electrode of said transistor being connected to said negative power source via a second variable resistor and being connected to ground via a second capacitor;
the collector electrode of said second transistor being connected to the output terminal; and
a resistor connected between said input terminal and said output terminal.

3. An audio amplifier circuit for amplifying a signal of low voltage level supplied by a moving coil-type cartridge source, said amplifier comprising:

an input terminal adapted to be connected to said signal source;
an output terminal;
a positive power source;
a negative power source;
a first compound transistor including a plurality of PNP-type transistors connected in parallel, said first compound transistor having a base electrode, an emitter electrode, a collector electrode, and an input resistance less than the value of impedance of said signal source;
the base electrode being connected to said input terminl via a first resistor;
the emitter electrode being connected to said positive power source via a series connection of a second resistor and a third resistor and being connected to ground via a first capacitor;
the collector electrode being connected to the output terminal;
a second compound transistor including a plurality of NPN-type transistors connected in parallel, said second compound transistor having a base electrode, an emitter electrode, a collector electrode and an input resistance less than the value of impedance of said signal source;

the base electrode of said second compound transistor being connected to the input terminal via said first resistor;

the emitter electrode of said second compound transistor being connected to said negative power source via a series connection of a fourth resistor and a fifth resistor and being connected to ground via a second capacitor;

the collector electrode of said second compound transistor terminal connected to the output terminal; and a sixth resistor connected between said output terminal and the base electrodes of said first and second compound transistors.

4. An audio amplifier circuit for amplifying a signal of low voltage level, comprising:

an input terminal;

an output terminal;

a positive power source;

a negative power source;

a first transistor, of the PNP type, having a collector electrode, an emitter electrode, a base electrode and a base spreading resistance not exceeding 10 ohms;

the collector electrode being connected to said output terminal;

the emitter electrode being connected to said positive power source via a series connection of a first resistor and a first variable resistor and being connected to ground via said first resistor and a first capacitor;

the base electrode being connected to said input terminal by a parallel connection of a first diode and a second capacitor;

a second transistor, of the NPN type, having a collector electrode, an emitter electrode, a base electrode and a base spreading resistance not exceeding 10 ohms;

the collector electrode of the second transistor being connected to said output terminal;

the emitter electrode of the second transistor being connected to said negative power source via a series connection of a third resistor and fourth resistor and being connected to ground via said third resistor and a third capacitor;

the base electrode of the second transistor being connected to said input terminal by a parallel connection of a second diode and a fourth capacitor; and a fifth resistor connected between said input terminal and said output terminal.

5. An audio amplifier circuit for amplifying a signal of low voltage level supplied by a moving coil-type cartridge source, said amplifier comprising:

an input terminal adapted to be connected to said signal source;

an output terminal;

a power source;

transistor means including a plurality of transistors each having base, emitter and collector electrodes, said transistor means having an input resistance of a value less than the value of impedance of said signal source and the transistors being interconnected whereby corresponding electrodes of each transistor are connected, respectively, to the input terminal, the output terminal, and the power source; and a resistor connected between the output terminal and said input terminal.

6. An audio amplifier circuit as set forth in claim 5, wherein each of said transistors is a power transistor operated at a range where its emitter resistance exhibits the smallest values in its characteristic curve.

7. An audio amplifier as set forth in claim 5, wherein said plurality of transistors are connected in parallel.

* * * * *